(12) United States Patent
Yoneda

(10) Patent No.: US 6,781,221 B2
(45) Date of Patent: Aug. 24, 2004

(54) PACKAGING SUBSTRATE FOR ELECTRONIC ELEMENTS AND ELECTRONIC DEVICE HAVING PACKAGED STRUCTURE

(75) Inventor: Yoshihiro Yoneda, Matto (JP)

(73) Assignee: Shinko Electric Industries Co., Ltd., Nagano (JP)

(*) Notice: Subject to any disclaimer, the term of this patent is extended or adjusted under 35 U.S.C. 154(b) by 63 days.

(21) Appl. No.: 10/170,365

(22) Filed: Jun. 14, 2002

(65) Prior Publication Data
US 2002/0195696 A1 Dec. 26, 2002

(30) Foreign Application Priority Data
Jun. 21, 2001 (JP) ........................... 2001-188496

(51) Int. Cl.[7] ............................................. H01L 23/02
(52) U.S. Cl. ................. 257/678; 257/766; 257/778; 257/777
(58) Field of Search ............... 257/678, 690, 257/692, 701, 723, 724, 751, 738, 750, 766, 772, 777, 778, 779, 780

(56) References Cited

U.S. PATENT DOCUMENTS

| | | | | |
|---|---|---|---|---|
| 6,249,053 B1 | * | 6/2001 | Nakata et al. | 257/738 |
| 6,494,361 B1 | * | 12/2002 | Scanlan et al. | 228/223 |
| 6,621,172 B2 | * | 9/2003 | Nakayama et al. | 257/787 |
| 2002/0024350 A1 | * | 2/2002 | Roberts et al. | 324/765 |
| 2002/0056706 A1 | * | 5/2002 | Trejo | 219/56.22 |
| 2002/0172025 A1 | * | 11/2002 | Megahed et al. | 361/767 |
| 2003/0107137 A1 | * | 6/2003 | Stierman et al. | 257/763 |

* cited by examiner

Primary Examiner—Eddie Leg
Assistant Examiner—Douglas W. Owens
(74) Attorney, Agent, or Firm—Staas & Halsey LLP

(57) ABSTRACT

A packaging substrate for electronic elements comprises a first area for receiving an electronic element through flip chip bonding and a second area for receiving an electronic element through wire bonding. The first area has a bonding pad having applied on a surface thereof a coating of a solder material. The packaging substrate is used in the production of an electronic device having mounted thereon electronic elements such as semiconductor chips.

19 Claims, 6 Drawing Sheets

PACKAGING SUBSTRATE FOR ELECTRONIC ELEMENTS AND ELECTRONIC DEVICE HAVING PACKAGED STRUCTURE

BACKGROUND OF THE INVENTION

1. Field of the Invention

The present invention relates to a packaging substrate for electronic parts or elements such as semiconductor chips and to an electronic device having the packaged electronic elements. More particularly, the present invention relates to a packaging substrate designed to receive thereon electronic elements using different packaging methods, and an electronic device having the electronic elements packaged using such a packaging substrate.

2. Description of the Related Art

At present, a wide variety of packaging substrates are commercially available as substrates for packaging electronic parts such as semiconductor chips. Some packaging substrates are designed to receive on the same substrate different types of electronic parts such as semiconductor chips for a microprocessor and semiconductor chips for a memory. On these packaging substrates, the semiconductor chips are sometimes mounted with different packaging methods, that is, one type of semiconductor chip is mounted with a wire bonding method, and another type of semiconductor chip is mounted with a flip chip bonding method.

Generally, when a wire bonding method is used in the packaging of semiconductor chips on the packaging substrate, a bonding pad is formed on predetermined sites of a surface of the substrate. The bonding pad is generally produced by forming a wiring pattern from a wiring material such as copper (Cu), followed by forming on the wiring pattern a plating layer consisting of nickel (Ni) plating and gold (Au) plating. The plating layer is applied to improve the bonding strength between the bonding pad and the bonding wire.

On the other hand, when a flip chip bonding method is used in the packaging of semiconductor chips, a solder bump is generally applied to between a bonding pad of the packaging substrate and an external terminal or electrode of the semiconductor chips. Further, when the electrode of the semiconductor chips has a protruded electrode, comprising gold (Au) as a principal component thereof, on a tip position thereof, a solder material such as Sn—Pb or Sn—Ag is previously applied to the bonding pad of the substrate, and then the protruded Au electrode is bonded through the solder material to the bonding pad.

Thus, when the semiconductor chip designed for wire bonding and the semiconductor chip designed for flip chip bonding have to be mounted on the same packaging substrate, to avoid any problems caused due to packaging of two different semiconductor chips, bonding pads for the wire bonding and flip chip bonding were typically produced by forming wiring patterns from a suitable wiring material such as copper on the substrate. The wiring patterns were then plated with nickel and gold to form bonding pads which are suitable for wire bonding. Some of the thus obtained bonding pads were further coated with a soldering material to form solder-coated bonding pads suitable for flip chip bonding.

The above-described prior art method for forming the different bonding pads in the packaging substrate and the semiconductor device using the produced packaging substrate with the different bonding pads will be further described hereinafter with reference to FIG. 1 showing the constitution of the prior art packaging substrate 11 having the area A designed to receive thereon an electronic element through wire bonding and the area B designed to receive thereon an electronic element through flip chip bonding, FIG. 2 showing the construction of the electronic device, particularly semiconductor device 10, using the packaging substrate of FIG. 1, and FIGS. 3A and 3B showing the constitution of the different bonding pads 12 and 55 used in the semiconductor device 10 of FIG. 2.

As illustrated in FIG. 2, the semiconductor device 10 comprises a packaging substrate 11 and one main surface of the substrate 11 bears both of a semiconductor chip 20 for wire bonding and a semiconductor chip 30 for flip chip bonding, while another main surface of the substrate 11 opposed to the chips-bearing surface has a group of solder bumps 40 acting as an external connection terminal. The chip-bearing surface of the substrate 11 has formed thereon a wiring pattern 17 made of copper, and an insulating material 18 is further deposited except for the areas of the bonding pads 12 and 55.

Referring to the area A of the packaging substrate 11, there is illustrated the semiconductor chip 20 mounted on and bonded through an adhesion layer 21 to the substrate 11, and its I/O terminal (not shown) is electrically connected through an Au bonding wire 22 to a bonding pad 12. As shown in FIG. 3A, the bonding pad 12 is formed on the Cu wiring pattern 17 of the substrate 11, and is constituted from a plating layer 14 formed by sequentially plating on a surface of the wiring pattern 17 a nickel plating 14a and a gold plating 14b.

Referring to the area B of the packaging substrate 11, there is illustrated the semiconductor chip 30 mounted through flip chip bonding to the substrate 11. After positioning of the protruded electrode 32 of the semiconductor chip 30 to the bonding pad 55 formed on the wiring pattern 17 of the substrate 11, the semiconductor chip 30 is bonded to the bonding pad 55 through a solder material 56 applied to a surface of the pad 55. The protruded electrode 32 is generally formed in the form of an Au stud bump. As shown in FIG. 3B, the bonding pad 55 has a constitution similar to that of the bonding pad 12 except that its plating layer 14 consisting of a Ni plating 14a and an Au plating 14b further has a solder layer 56 to which the protruded electrode 32 is embedded for the bonding purpose. The space between the substrate 11 and the semiconductor chip 30 is filled with an electrically insulating under-filling resin 34. Further, in the semiconductor device 10, semiconductor chips 20 and 30 as well as other parts including the bonding wire 22 are covered and protected with an electrically insulating sealing resin 36.

However, the prior art semiconductor devices such as those described above, referring to the attached drawings, suffer from important problems. The first problem is a problem caused in the bonding pad 55 for flip chip bonding due to diffusion of the gold from the Au plating 14b appearing on a surface of the bonding pad 55 to the solder layer 56. Since an amount of the solder on the bonding pad 55 is low, a melting point of the solder layer 56 can be remarkably increased as a result of inclusion of the gold in the solder.

The problem of an increase in the melting point of the solder is particularly serious when the electrodes 32 are densely disposed on the semiconductor chip 30, because a bonding surface of the bonding pads 55 is reduced with an increase of the distribution density of the electrodes 32, and thus an amount of the solder to be applied to each bonding pad 55 is reduced. In other words, a ratio of the gold diffused in the solder is further increased, and as a result, the melting point of the solder is further increased.

In addition to the increase in the melting point of the solder, the melting point of the solder can be varied as a result of variation of the amount of the solder supplied to each bonding pad 55. The variation of the amount of the solder is caused, because a pitch between the adjacent bonding pads 55 is narrowed in conformity with an increase in the distribution density of the electrodes 32. As the melting point of the solder can be varied within about 50° C., it becomes difficult to ensure a reliable solder bonding between the semiconductor chip 30 and the substrate 11.

Another problem arises due to the application of a solder to the bonding pad and other parts of the wiring pattern. For example, when a solder should be coated to the bonding pad, it is conventionally carried out to supply and print a solder paste at a predetermined pattern on the pad. However, when a pitch between the adjacent bonding pads is as small as 100 μm or less as in the packaging substrate for flip chip bonding of the semiconductor chips, there arises a problem due to the constitution of the bonding pads, that is, a short-circuiting problem can be caused as a result of bridging of the solder between the pads.

Further, to ease an application of the solder to the bonding pads, it is possible to simultaneously coat a solder to the bonding pads for wire bonding, in addition to coating of the solder to the bonding pads for flip chip bonding. However, in such a case, as a surface of the bonding pads for wire bonding is also covered with the coated solder, it becomes difficult to wire bond of the pads, thereby extending the time for the wire bonding.

SUMMARY OF THE INVENTION

The present invention is directed to solve the above-described problems in the prior art packaging substrates and the semiconductor and other devices using the packaging substrate.

It is an object of the present invention to provide a packaging substrate capable of packaging electronic devices such as semiconductor chips using different packaging methods, i.e., wire bonding packaging and flip chip packaging, without causing any problems such as defective solder bonding, short-circuiting of the wiring pattern, and troublesome and time-consuming wire bonding, but with high reliability.

It is another object of the present invention to provide an electronic device having mounted on a substrate thereof, with high reliability, one or more electronic elements mounted by wire bonding and one or more electronic elements mounted by flip-chip bonding.

These and other objects of the present invention will be easily understood from the following detailed description of the preferred embodiments of the present invention.

The inventor of the present invention has conducted intensive studies for accomplishing the objects described above and, surprisingly, the inventor has discovered that the above objects can be accomplished if the bonding pad for flip chip bonding of semiconductor chips and other electronic elements is constituted to be free of gold (Au) and nickel (Ni) plating.

According to one aspect of the present invention, there is provided a packaging substrate for electronic elements, on which substrate two or more electronic elements are mounted through flip chip bonding and wire bonding, in which the packaging substrate comprises at least one first area designed to receive thereon an electronic element through flip chip bonding and at least one second area designed to receive thereon an electronic element through wire bonding, the first area of the packaging substrate has at least one bonding pad to which an external terminal of the electronic element is connected, and the bonding pad comprises a copper-based material having applied on a surface thereof a coating of a solder material, and the second area of the packaging substrate has at least one bonding pad to which an end portion of the bonding wire extended from an external terminal of the electronic element is connected, and the bonding pad comprises a copper-based material having applied on a surface thereof a plating layer comprising a combination of nickel plating and gold plating.

According to another aspect of the present invention, there is provided an electronic device comprising a packaging substrate and two or more electronic elements mounted through flip chip bonding and wire bonding on the packaging substrate, in which the packaging substrate comprises at least one first area designed to receive thereon an electronic element through flip chip bonding and at least one second area designed to receive thereon an electronic element through wire bonding, the first area of the packaging substrate has a bonding pad comprising a copper-based material having applied on a surface thereof a coating of a solder material, and an electronic element for flip chip bonding is mounted on the first area of the packaging substrate, while the bonding pad is electrically connected with an external terminal of the electronic element, and the second area of the packaging substrate has a bonding pad comprising a copper-based material having applied on a surface thereof a plating layer comprising a combination of nickel plating and gold plating, and an electronic element for wire bonding is mounted on the second area of the packaging substrate, while the bonding pad is electrically connected through a bonding wire with an external terminal of the electronic element.

DESCRIPTION OF THE PREFERRED EMBODIMENTS

Figure 1:
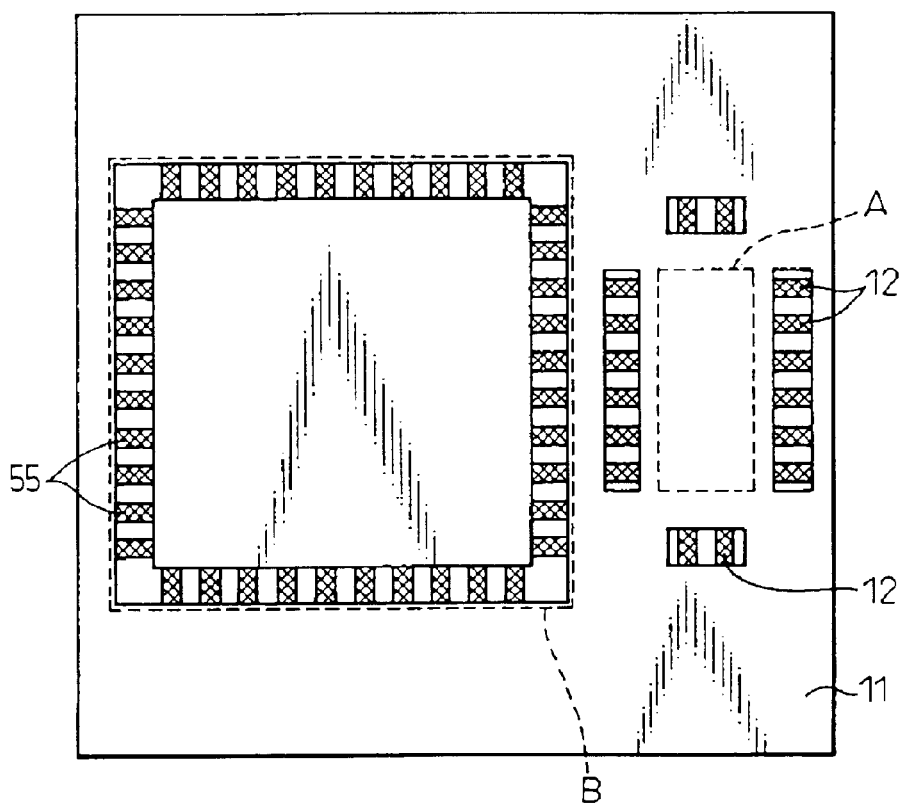
FIG. 1 is a plan view schematically showing the constitution of the prior art packaging substrate for electronic elements.
Figure 2:
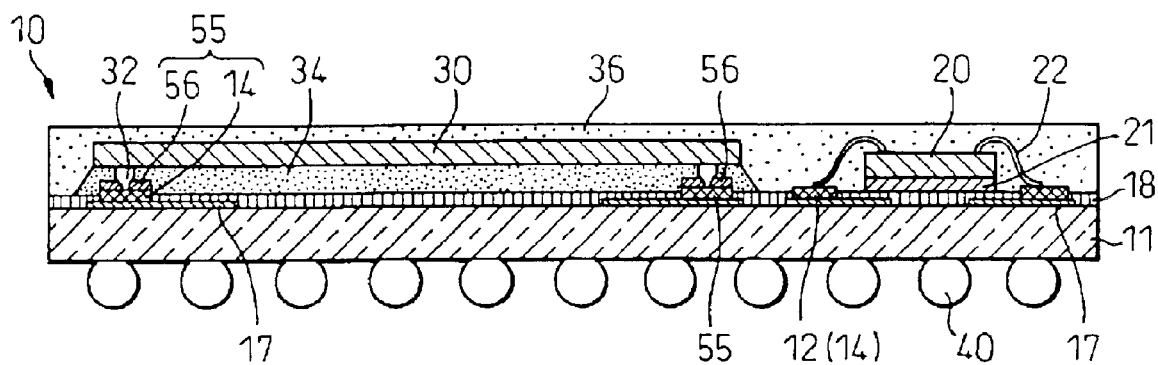
FIG. 2 is a cross-sectional view schematically showing the construction of the prior art electronic device using the packaging substrate of FIG. 1.

The present invention resides in a packaging substrate for electronic elements. The electronic elements used in the practice of the present invention include a wide variety of electronic elements conventionally used in the field of electronics, and typical examples of the electronic elements include, but are not restricted to, semiconductor elements such as LSI and other semiconductor chips. For example, the semiconductor chips include a microprocessor, DSP, ASIC, and a memory. These semiconductor elements may be mounted in any desired combination of two or more elements on the packaging substrate, and, if desired, any other electronic parts may be also packaged in the same substrate.

The packaging substrate generally comprises an electrically insulating base and wiring pattern. The base generally comprises an electrically insulating material such as glass, ceramics and plastics. Typical examples of suitable packaging substrate includes, but are not restricted to, a resin substrate such as a glass epoxy substrate with the Cu wiring patterns or a built-up substrate with the Cu wiring patterns.

The packaging substrate is used at different thickness depending upon the size and constitution of the electronic device using the same, and a thickness of the it substrate is generally in the range of about 100 to 2,000 $\mu$m, and preferably in the range of about 150 to 1,000 $\mu$m.

In the packaging substrate of the present invention, two or more electronic elements are mounted on the substrate, with the proviso that at least one electronic element is mounted through flip chip bonding and at least one electronic element is mounted through wire bonding.

To ensure the above packaging structure, the packaging substrate comprises at least one first area designed to receive thereon an electronic element through flip chip bonding and at least one second area designed to receive thereon an electronic element through wire bonding.

The first area for flip chip bonding of the electronic element and the second area for wire bonding of the electronic element may be positioned in one or both of the surfaces of the packaging substrate and also in any one or more sites of the surface, depending upon desire, insofar as they satisfy the requirements of the present invention.

For example, the packaging substrate has the first area for flip chip bonding and the second area for wire bonding on different surfaces thereof. In this embodiment, one or more flip chip bonded electronic elements are mounted on one surface of the substrate, and one or more wire bonded electronic elements are mounted on an opposed surface of the substrate, thus enabling to selectively package different types of the electronic elements on both surfaces of the substrate. Of course, the substrate may have additional parts on one or both surfaces of the substrate, if desired.

Alternatively, the packaging substrate may have the first area for flip chip bonding and the second area for wire bonding on the same surface thereof. In this embodiment, one or more flip chip bonded electronic elements and one or more wire bonded electronic elements are mounted in any desired pattern on one and same surface of the substrate. Of course, another opposed surface of the substrate may bear additional parts, if desired.

On the packaging substrate, the first area for flip chip bonding has at least one bonding pad to which an external terminal of the electronic element is connected. Thus, the number of the bonding pads generally corresponds to the number of the external terminals of the electronic element. The bonding pad comprises a copper-based material, and a coating of a solder material is applied on a surface thereof.

The copper (Cu)-based material used in the formation of the bonding pad is not restricted. Examples of suitable Cu-based material include, but not restricted to, Cu and its alloys and the like. Copper is preferably used, because the bonding pad and the wiring pattern can be simultaneously produced.

Examples of suitable solder material coated to the bonding pad include, but are not restricted to, Sn—Pb, Sn—Ag, Sn—Ag—Cu and the like. A solder paste containing Sn—Ag is preferably used.

The second area for wire bonding has at least one bonding pad to which an end portion of the bonding wire extended from an external terminal of the electronic element is connected. The number of the bonding pads generally corresponds to the number of the external terminals of the electronic element.

The bonding pad is formed from a copper-based material which is preferably those described above with regard to the bonding pads for flip chip bonding. The bonding pad has applied on a surface thereof a plating layer comprising a combination of nickel plating and gold plating. That is, the plating layer has a composite structure and it is formed by sequentially plating nickel and gold in accordance with the conventional plating methods. The thickness of the plating layer is widely varied, and generally it is in the range of about 1 to 10 $\mu$m (Ni) and about 0.1 to 3 $\mu$m (Au), and preferably in the range of about 3 to 8 $\mu$m (Ni) and about 0.3 to 3 $\mu$m (Au).

When the packaging substrate has the first area for flip chip bonding and the second area for wire bonding on the same surface thereof, it is preferred that the first area for flip chip bonding and the second area for wire bonding are discretely positioned in the same surface of the packaging substrate.

Further, it is also preferred that the second area for wire bonding is positioned surrounding the first area for flip chip bonding in the same surface of said packaging substrate. In such a constitution of the packaging substrate, it becomes possible to laminate the electronic element for flip chip bonding and the electronic element for wire bonding on the same side of the substrate, thereby providing a multi-chip packaging structure comprising stacked elements.

Furthermore, it is also preferred that another surface of the packaging substrate opposed to the surface having the first and second areas has at least one external connection terminal. The external connection terminal used herein is not restricted, but is preferably in the form of electrically conductive bump, typically solder bump. Any other terminal material may be used, if desired.

In addition to the packaging substrate, the present invention resides in an electronic device using the packaging substrate of the present invention. The electronic device comprising a packaging substrate and two or more electronic elements mounted through flip chip bonding and wire bonding substrate on the packaging substrate. In the electronic device, the packaging substrate comprises at least one first area mounted thereon an electronic element through flip chip bonding and at least one second area mounted thereon an electronic element through wire bonding.

The first area of the packaging substrate has a bonding pad comprising a copper-based material having applied on a surface thereof a coating of a solder material, and an electronic element for flip chip bonding is mounted on the first area of said packaging substrate, while the bonding pad is electrically connected with an external terminal of the electronic element. The constitution of the bonding pad was described above.

The second area of the packaging substrate has a bonding pad comprising a copper-based material having applied on a surface thereof a plating layer comprising a combination of nickel plating and gold plating, and an electronic element for wire bonding is mounted on the second area of said packaging substrate, while the bonding pad is electrically connected through a bonding wire with an external terminal of the electronic element. The constitution of the bonding pad is described above.

As described above, the packaging substrate may separately have the first and second areas on opposed surfaces thereof, or alternatively, the packaging substrate may have the first and second areas on the same surface thereof.

Further, the first area for flip chip bonding and the second area for wire bonding may be discretely positioned in the same surface of the packaging substrate, or the second area for wire bonding may be positioned surrounding the first area for flip chip bonding in the same surface of the packaging substrate. In the latter embodiment, the electronic element for wire bonding is preferably mounted over the electronic element for flip chip bonding so that the electronic device has a stacked structure of the semiconductor elements in the surface of the packaging substrate.

The electronic device may further comprise at least one external connection terminal in a suitable site on the packaging substrate. The external connection terminal is preferably disposed on one surface of the substrate, although it may be disposed on both surfaces of the substrate, if desired.

In one preferred embodiment of the present invention, one surface of the packaging substrate has both the flip chip bonded electronic element and the wire bonded electronic element, and another surface of the substrate opposed to the surface having the above elements has at least one external connection terminal. As described above, the external connection terminal is preferably in the form of electrically conductive bump, typically solder bump.

In the electronic device of the present invention, it is preferred that the electronic element for flip chip bonding has an electrode provided with a protruded electrode portion. The electrode is preferably formed from an aluminum (Al)-based material, and the protruded electrode portion is preferably formed from any metal comprising Au as a principal component thereof. The protruded electrode portion is bonded to the bonding pad through the coating of the solder material applied on a surface of the bonding pad.

Further, it is preferred that a space between the electronic element for flip chip bonding and the underlying packaging substrate further comprises a sealed structure formed upon filling of an under-filling material into the space. The under-filling material used herein is preferably an epoxy resin with $SiO_2$ filler.

Furthermore, it is preferred that the electronic device further comprises a sealing layer covering substantially all of the electronic elements. That is, the electronic elements-mounted surface of the packaging substrate has a sealing layer applied over the substrate and, thus, the electronic elements, the bonding wire and the like are embedded in the sealing layer. The sealing layer is preferably formed from an electrically insulating and humidity-resistant resinous material. Examples of suitable resinous material include, but are not restricted to, epoxy resin and others.

As described in the initial portion of this section, the electronic element is preferably a semiconductor element such as semiconductor chip, although other electronic elements may be used and any conventional parts other than the electronic element may be additionally used.

The present invention will be further described with regard to the preferred embodiments thereof referring to the accompanying drawings. Note, however, that the present invention should not be restricted to the illustrated packaging of the semiconductor chips, and any other electronic elements and/or electronic parts may be further packaged in desired sites of the packaging substrate.

Figure 4:
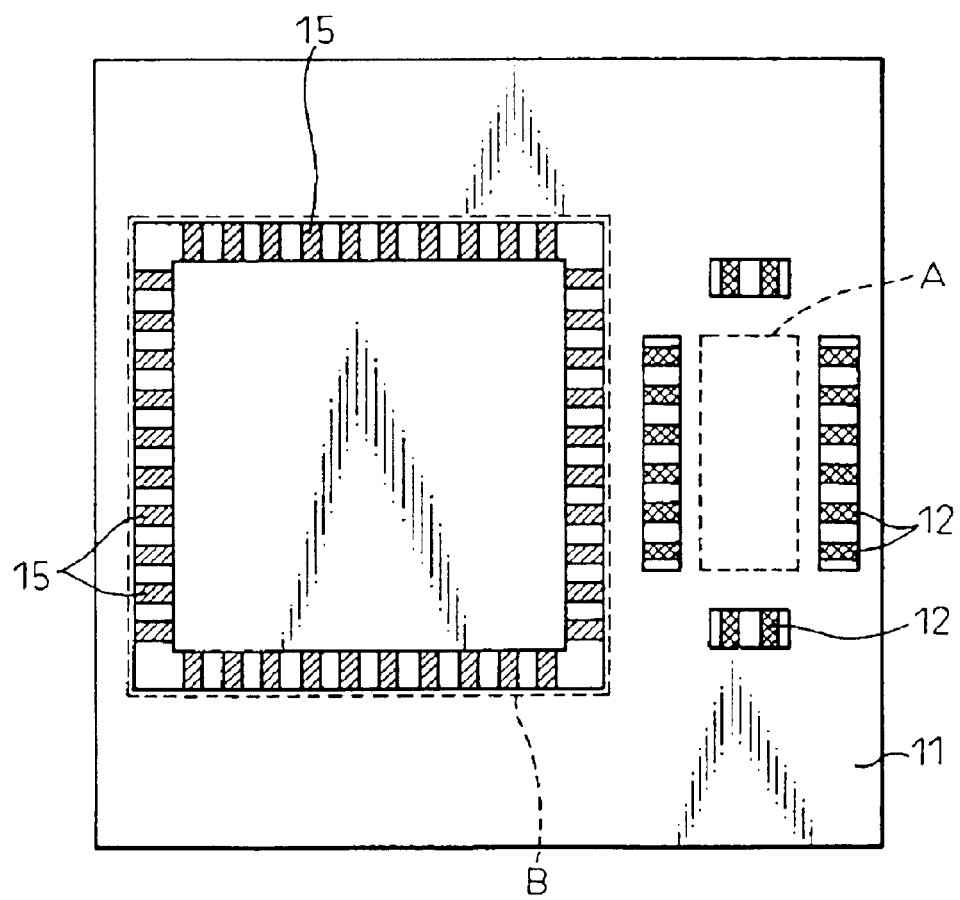
FIG. 4 is a plan view schematically showing the constitution of the packaging substrate for electronic elements according to one preferred embodiment of the present invention.
Figure 5:
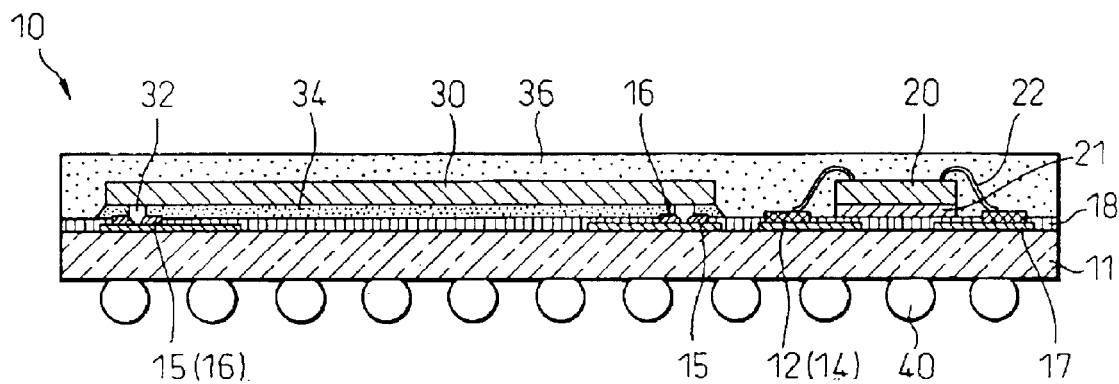
FIG. 5 is a cross-sectional view schematically showing the construction of the electronic device using the packaging substrate of FIG. 4.
Figure 6A:
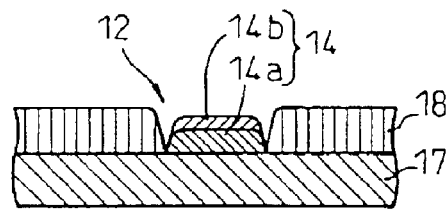
FIGS. 6A and 6B each is a cross-sectional view of the bonding pad used in the electronic device of FIG. 5.
Figure 6B:
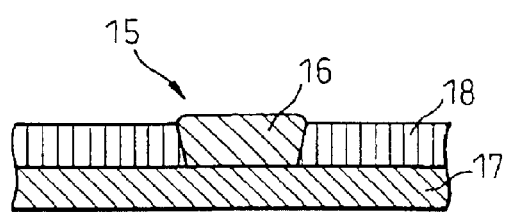

FIG. 4 is a plan view showing the constitution of the packaging substrate 11 according to one preferred embodiment of the present invention. As illustrated, the packaging substrate 11 has on one main surface thereof the area A designed to be mounted thereon a semiconductor chip through wire bonding and the area B designed to be mounted thereon a semiconductor chip through flip chip bonding. FIG. 5 is a cross-sectional view showing the construction of the electronic device, particularly semiconductor device 10, using the packaging substrate of FIG. 4. FIGS. 6A and 6B are cross-sectional views showing the constitution of the different bonding pads 12 and 15 used in the area A and the area B of the packaging substrate 11 of FIG. 4, respectively. Note, however, that the illustrated semiconductor device 10 may have any variations or modifications within the scope of the present invention. For example, two or more semiconductor chips 20 and 30 may be packaged on the substrate 11 in place of the illustrated single use of the chips 20 and 30.

The packaging substrate 11 used herein may be any conventional packaging substrate, and typical examples of suitable packaging substrate include, but are not restricted to, a resin substrate such as a glass epoxy substrate having the Cu wiring patterns in which the wiring patterns were formed upon etching of the copper foil applied to the substrate or a built-up substrate having the Cu wiring patterns in which the wiring patterns were formed by Cu plating.

The packaging substrate 11 comprises the area A for mounting a semiconductor chip 20 through wire bonding and the area B for mounting a semiconductor chip 30 through flip chip bonding, although the areas A and B each may be two or more, if desired.

Referring to the area A of the packaging substrate 11 of FIG. 4 along with FIG. 5, there is illustrated the semiconductor chip 20 mounted on and bonded through an adhesion layer 21 to the substrate 11, and its I/O terminal (not shown) is electrically connected through an Au bonding wire 22 to a bonding pad 12. As shown in FIG. 4, the bonding pads 12 are disposed so that it surrounds a substantial portion of the peripheral of the area A.

Further, as shown in FIG. 6A, the bonding pads 12 are each formed on the Cu wiring pattern 17 of the substrate 11, and are constituted from a plating layer 14 formed by sequentially plating on a surface of the wiring pattern 17 a nickel plating 14a and a gold plating 14b. Of course, if desired, any other conductive material may be used in place of copper in the formation of the wiring pattern 17.

Referring to the area B of the packaging substrate 11 of FIG. 4 along with FIG. 5, there is illustrated the semiconductor chip 30 mounted through flip chip bonding to the substrate 11. After positioning of the protruded electrode 32 of the semiconductor chip 30 to the bonding pad 15 formed on the wiring pattern 17 of the substrate 11, the semiconductor chip 30 is bonded to the bonding pad 15 through a solder material 16 applied to a surface of the pad 15. The protruded electrode 32 is generally formed in the form of an Au stud bump.

Figure 3A:
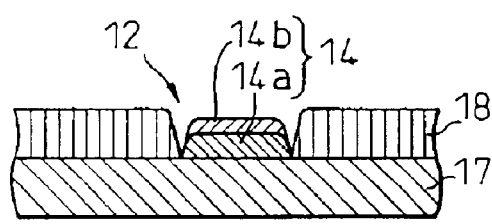
FIGS. 3A and 3B each is a cross-sectional view of the bonding pad used in the electronic device of FIG. 2.
Figure 3B:
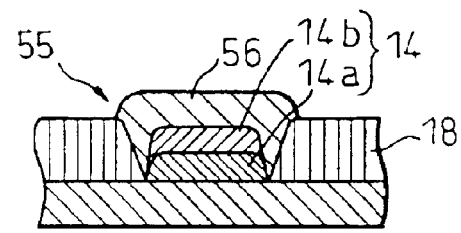

As shown in FIG. 6B, the bonding pad 15 has a simple structure in comparison to the bonding pad 55 of FIG. 3B. 9 The bonding pad 15 is constituted from a wiring pattern 17 formed from Cu and a covering solder layer 16. Of course, if desired, any other conductive material may be used in place of copper in the formation of the wiring pattern 17.

The bonding pads 12 and 15 are produced as follows.

To complete the bonding pad 12 for wire bonding, the plating layer 14 is formed on the wiring pattern 17 by sequentially plating a nickel plating 14a and a gold plating 14b, as described above. During the formation of the plating layer 14, plating should be carefully made to prevent an adhesion of the plating solutions to the bonding pad 15. A masking means such as resist resin is preferably applied to the bonding pad 15.

After completion of the bonding pad 12 for wire bonding, the wiring pattern 17 is coated with a soldering material to form a bonding pad 15 having a solder layer 16. The soldering process can be carried out by using any conventional soldering method including electrical plating such as so-called "Super Solder Method" developed by Harima Co., Ltd. and "Super Juffit Method" developed by Showa Denko Kabushikikaisha. These soldering methods are particularly effective to selectively adhere the solder to the wiring pattern 17 for flip chip bonding. The soldering material used herein is not restricted to, but preferably is, a solder such as Sn—Ag, Sn—Ag—Cu, and Pb—Sn.

As can be appreciated from the above explanation, while the bonding pad 12 for use in wire bonding has the plating layer 14 consisting of a Ni plating 14a and an Au plating 14b, the bonding pad 15 for use in flip chip bonding comprises the solder layer 16 directly applied to a surface of the wiring pattern 17 without inserting therebetween an intermediate plating layer. Further, as is shown in FIG. 4, the bonding pads 15 for flip chip bonding are disposed within the area B of the packaging substrate 11 and its distribution pattern corresponds to the pattern of the protruded electrode 32 of the semiconductor chip 30.

As illustrated in FIG. 5, the semiconductor device 10 comprises a packaging substrate 11 and one main surface of the substrate 11 has both of a semiconductor chip 20 for wire bonding and a semiconductor chip 30 for flip chip bonding. The semiconductor chip 20 is adhered to the substrate 11 through an adhesion layer 21, and is electrically connected through a bonding wire 22 to the bonding pad 12, and the semiconductor chip 30 is electrically connected through a solder layer 16 to the bonding pad 15 by flip chip bonding. Another main surface of the substrate 11 opposed to the chips-bearing surface has a group of solder bumps 40 acting as an external connection terminal. The external connection terminal 40 is bonded through a land (not shown) to the lower surface of the substrate 11. The chip-bearing surface of the substrate 11 has formed thereon a wiring pattern 17 made of copper, and an insulating material 18 is further deposited except for the areas of the bonding pads 12 and 15.

In the illustrated semiconductor device 10, since the bonding pads 12 in the wire bonding area A have a plating layer 14 consisting of a Ni plating 14a and an Au plating 14b, the bonding wire 22 can be strongly and reliably bonded to the bonding pad 12.

On the other hand, since the bonding pads 15 in the flip chip bonding area B have a solder coating 16 on the wiring pattern 17 consisting of Cu, undesired increase of the melting point of the solder caused upon diffusion of the gold into the solder can be prevented, thus enabling reliable packaging of the semiconductor chip 30 on the substrate 11. Flip chip bonding can be carried out by using any conventional bonding method and, preferably, it can be carried out by aligning the protruded electrodes 32 of the semiconductor chip 30 to the corresponding bonding pads 15 of the packaging substrate 11, heating the chip 30 to melt the solder coating 16, inserting the protruded electrode 32 in the melted solder coating 16, and cooling the resulting package to a temperature lower than the melting point of the solder. As a result of solidification of the solder, the protruded electrode 32 is strongly and reliably bonded to the bonding pad 15.

After the semiconductor chip 30 was flip-chip-bonded to the bonding pads 15, an electrically insulating under-filling resin 34 is filled into a space or gap formed between the substrate 11 and the semiconductor chip 30. A suitable under-filling resin is an epoxy resin with $SiO_2$ filler, for example. Thereafter, an overall surface of the substrate 11 is sealed with an electrically insulating sealing resin 36 so that the semiconductor chips 20 and 30, as well as other parts including the bonding wire 22, are covered and protected with an electrically insulating sealing resin 36. The formation of the resin-sealed layer can be preferably carried out by potting the sealing resin or using a mold for resin sealing. A suitable sealing resin is an epoxy resin, for example.

Figure 7:
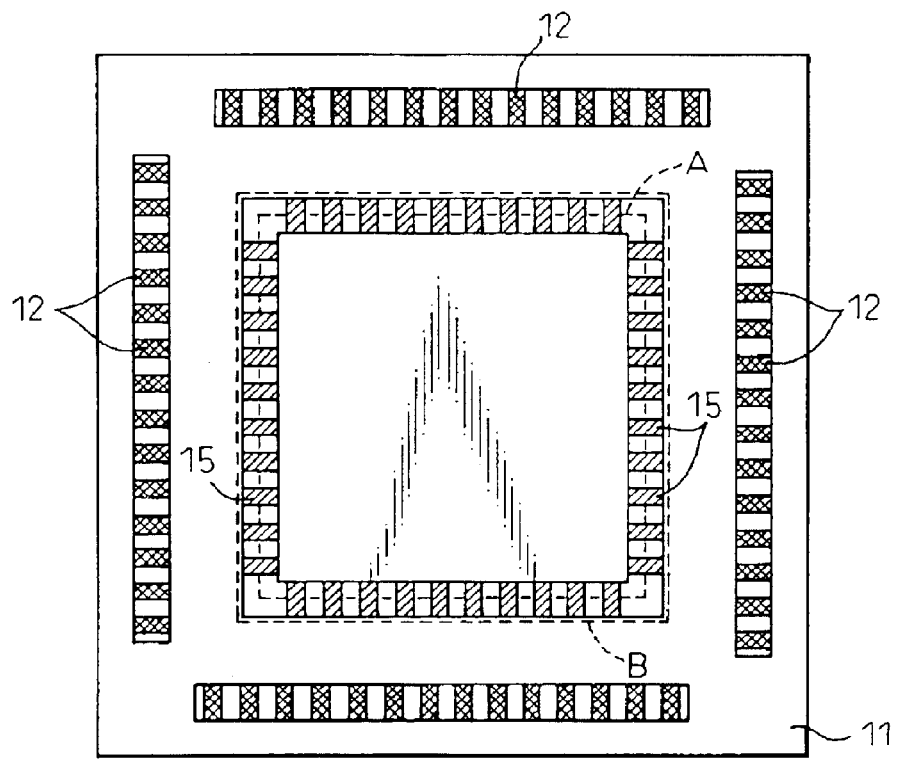
FIG. 7 is a plan view schematically showing the constitution of the packaging substrate for electronic elements according to another preferred embodiment of the present invention.
Figure 8:
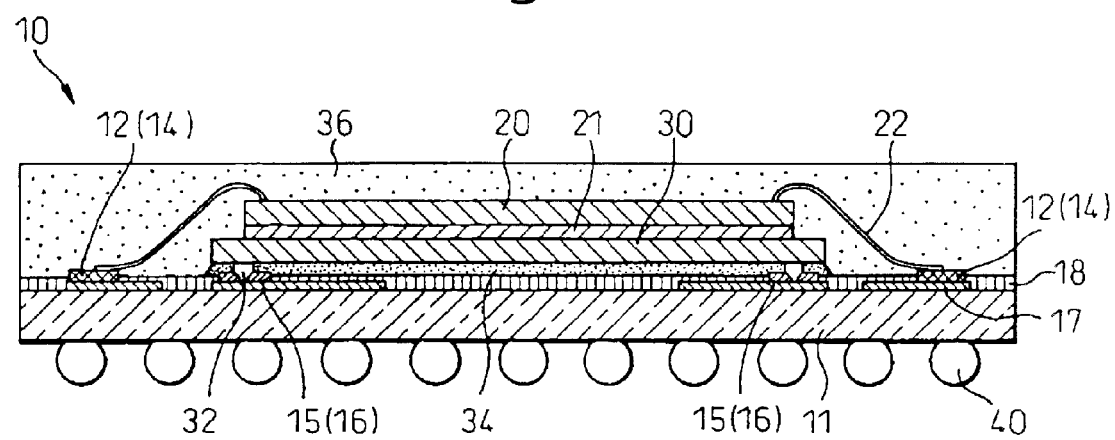
FIG. 8 is a cross-sectional view schematically showing the construction of the electronic device using the packaging substrate of FIG. 7.

FIGS. 7 and 8 show the packaging substrate according to another preferred embodiment of the present invention, and its packaged structure, i.e., a semiconductor device. As is described hereinafter, the semiconductor device 10 is characterized by having on one surface of the packaging substrate 11 the semiconductor chip 20 and the semiconductor chip 30. In this semiconductor device 10, the semiconductor chip 30 was mounted on the substrate 11 by flip chip bonding, and the semiconductor chip 20 was stacked over the chip 30 and electrically connected with wire bonding to the bonding pad 12 of the substrate 11. Note, however, that the illustrated semiconductor device 10 may have any variations or modifications within the scope of the present invention. For example, two semiconductor chips 30 may be packaged on the substrate 11 in place of the illustrated single use of the chip 30.

In the semiconductor device 10, after the semiconductor chip 30 was mounted on the substrate 11 by flip chip bonding, the semiconductor chip 20 for wire bonding is stacked over the chip 30. Accordingly, as illustrated in FIG. 7, the area A for mounting the chip 20 by wire bonding and the area B for mounting the chip 30 by flip chip bonding occupy the substantially same area. Generally, it is preferred that an external size of the chip 20 to be stacked over the chip 30 is the same or slightly smaller than that of the chip 30.

The bonding pad 12 for wire bonding and the bonding pad 15 for flip chip bonding, both formed on the packaging substrate 11, each may have the structure described above referring to FIGS. 6A and 6B, respectively. As shown in FIG. 7, the bonding pads 12 are disposed apart at a certain distance from the bonding pads 15 for flip chip bonding in such a manner that the bonding pads 12 are distributed surrounding a peripheral portion of the bonding pads 15, i.e., the area B. A surface of the bonding pads 12 has a plating layer 14 consisting of Ni plating and Au plating, and a surface of the bonding pads 15 has a solder layer 16.

The semiconductor device 10 of FIG. 8 can be produced, for example, in accordance with the following method. First, the semiconductor chip 30 is mounted on the packaging substrate 11 after its protruded electrodes 32 were aligned with the corresponding bonding pads 15 of the substrate 11, followed by filling an under-filling resin 34 in a gap between the chip 30 and the underlying substrate 11. Then, the semiconductor chip 20 is mounted over the chip 30 through an adhesion layer 21, and the chip 20 is electrically connected through the bonding wire 22 to the bonding pads 12. After completion of the electrical connection of the chip 20, a surface of the substrate 11 having mounted thereon the chips 20 and 30 is sealed with a sealing resin 36. The packaging substrate 11 has external connection terminals 40 in a surface opposed to the chip-bearing surface thereof. For example, a solder bump may be used as the external connection terminals 40.

In the semiconductor device 10, good and strong bonding can be obtained between the bonding wire 22 and the bonding pad 12 for wire bonding, because the bonding pad 12 has a double-coated plating layer 16 consisting of Ni and Au plating.

Further, for the flip chip bonding area A, since the bonding pad 15 is formed by directly applying a solder layer 16 to the wiring pattern 17, the semiconductor chip 30 can be effectively and reliably bonded to the bonding pad 15 without causing an increase of the melting point of the solder. That is, the protruded electrode 32 of the chip 30 can be bonded to the pad 15 with a high reliability. Moreover, even if the distance between the adjacent bonding pads 15 is reduced and thus an amount of the solder on each pad 15 is made very small, there is no variation in the melting point of the solder due to the reduced amount of the solder, and the protruded electrode 32 can be reliably bonded to the pad 15.

Figure 9:
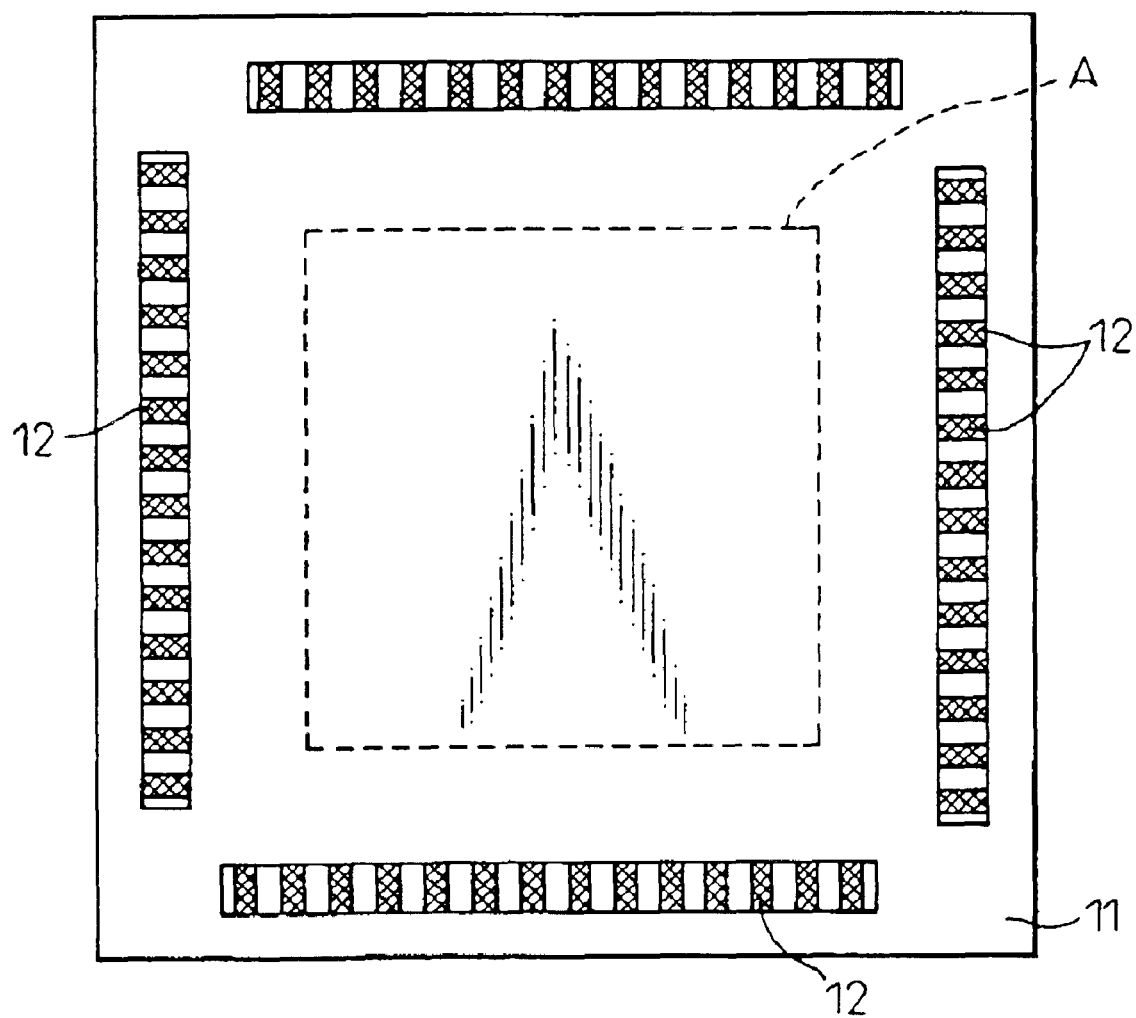
FIG. 9 is a plan view schematically showing the constitution of the packaging substrate for electronic elements according to still another preferred embodiment of the present invention.
Figure 10:
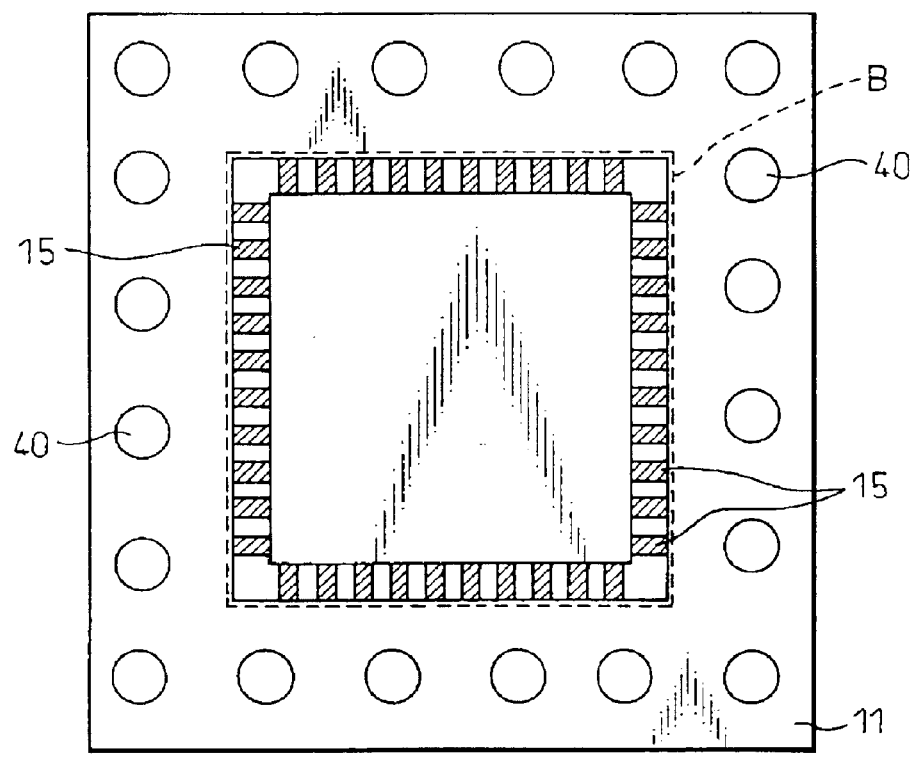
FIG. 10 is a bottom view of the packaging substrate shown in FIG. 9.
Figure 11:
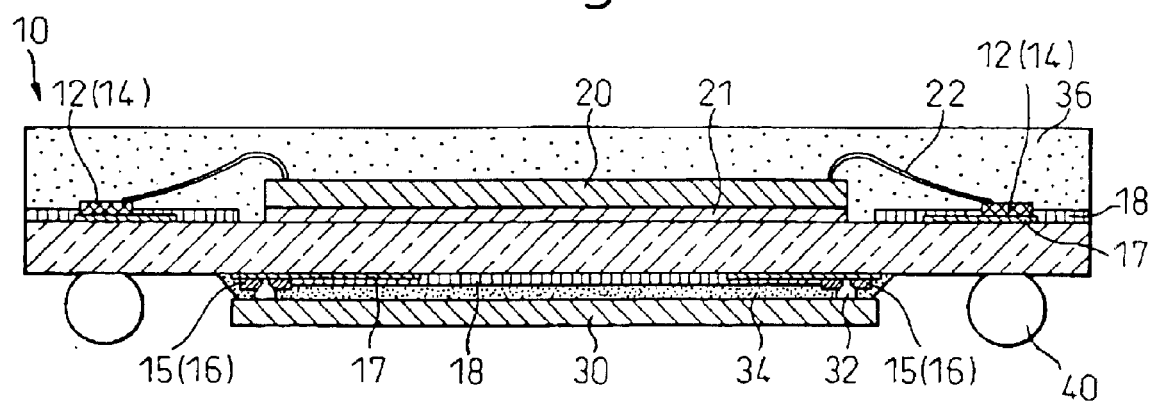
FIG. 11 is a cross-sectional view schematically showing the construction of the electronic device using the packaging substrate of FIGS. 9 and 10.

FIGS. 9 to 11 show the packaging substrate according to still another preferred embodiment of the present invention, and its packaged structure, i.e., semiconductor device. As is described hereinafter, the semiconductor device 10 is characterized by mounting on one surface of the packaging substrate 11 the semiconductor chip 20 for wire bonding and on another surface thereof the semiconductor chip 30 for flip chip bonding. Note, however, that the illustrated semiconductor device 10 may have any variations or modifications within the scope of the present invention. For example, two or more semiconductor chips 20 and 30 may be packaged on the substrate 11 in place of the illustrated single use of the chips 20 and 30.

FIG. 9 shows one surface, i.e., a top surface, of the packaging substrate 11 for mounting a semiconductor chip through wire bonding. The top surface has an area A on which a semiconductor chip is mounted and the area A has a group of bonding pads 12 disposed surrounding the same. The bonding pads 12 are used for wire bonding, and each comprises a wiring pattern, made of copper, and a plating layer consisting of Ni plating and Au plating, as is described below.

FIG. 10 shows another surface, i.e., a bottom surface, of the packaging substrate 11 for mounting a semiconductor chip through flip chip bonding. The bottom surface has an area B on which a semiconductor chip is mounted and a peripheral portion of the area B has a group of bonding pads 15. The bonding pads 15 are used for flip chip bonding, and each comprises a wiring pattern, made of copper, and a solder layer, as is described below. The bottom surface further has a group of external connection terminals 40. The terminals 40 are disposed surrounding an outer peripheral portion of the chip. A solder bump may be used as the terminal 40.

FIG. 11 shows the semiconductor device 10 using the packaging substrate 11 of FIGS. 9 and 10. As illustrated, a semiconductor chip 20 is mounted through wire bonding on a top surface of the substrate 11, and a semiconductor chip 30 is mounted through flip chip bonding on a bottom surface of the substrate 11.

The semiconductor device 10 of FIG. 11 can be produced, for example, in accordance with the following method.

First, the semiconductor chip 30 is mounted on a bottom surface of the substrate 11 after its protruded electrodes 32 were aligned with the corresponding bonding pads 15 of the substrate 11, followed by filling an under-filling resin 34 in a gap between the chip 30 and the substrate 11. Then, the semiconductor chip 20 is mounted on a top surface of the packaging substrate 11 through an adhesion layer 21, and the chip 20 is electrically connected through a bonding wire 22 to the bonding pads 12. After wire bonding of the chip 20, the surface of the substrate 11 having mounted thereon the chip 20 is sealed with a sealing resin 36.

As in the semiconductor devices described above with reference to FIGS. 4 to 8, a good and strong bond can be also obtained between the bonding wire 22 and the bonding pad 12 for wire bonding in the semiconductor device 10 because of the presence of the plating layer 14 consisting of Ni and Au plating. Further, because of direct application of the solder layer 16 to the wiring pattern 17, the semiconductor chip 30 can be effectively and reliably bonded through flip chip bonding to the bonding pad 15 without increase of the melting point of the solder, and thus the protruded electrode 32 of the chip 30 can be bonded to the pad 15 with a high reliability. Accordingly, the resulting semiconductor device 10 can exhibit a high reliability, while ensuring the expected high performances and other properties.

In the semiconductor device 10 of FIG. 11, each one chip was mounted on the packaging substrate 11 with regard to two types of the semiconductor chips, i.e., the semiconductor chip 20 for wire bonding and the semiconductor chip 30 for flip chip bonding. However, it should be noted that the packaging of the semiconductor chip is not restricted to a single use of the chip per type. Similarly, in the semiconductor device 10 of each of FIGS. 5 and 8, a number of the semiconductor chips 20 and 30 may be increased to two or more and, at the same time, a pattern of disposal of the chips may be freely changed, along with a disposal density of the chips, depending on various factors such as size of the chips, prevention of short-circuiting and other defects, and desired properties of the device.

As described above, in the packaging substrate used in the production of the electronic device according to the present invention, a bonding pad for use in flip chip bonding is produced by directly applying a solder layer to a wiring pattern consisting of Cu without applying a plating layer to the Cu pattern. Therefore, when a plating layer consisting of Ni plating and Au plating is applied to the Cu pattern in the production of the bonding pads for wire bonding, it is desired to protect the bonding pad for flip chip bonding from the plating solutions. For this purpose, any masking means is preferably covered over the bonding pad for flip chip bonding during the plating process. On the other hand, when a soldering material is applied to the wiring pattern in the production of the bonding pads for flip chip bonding, it is desired to use a specific method enabling it to selectively coat the soldering material onto only the bonding pad for flip chip bonding.

The bonding pads for flip chip bonding, as described above, are closely disposed with a small distance between the pads, with a reduced area of the pad. It is therefore difficult to exactly apply a soldering material to the bonding pad for flip chip bonding by using a conventional paste printing method in which a nozzle of the solder paste is required to be aligned with each bonding pad. In fact, using the paste printing method, there arise the problems that the solder paste cannot be supplied to a finely patterned-bonding pad without causing a variation in the amount of the supplied paste, and that short-circuiting with the adjacent bonding pad can be resulted upon dropping of the paste during reflow soldering. However, the inventor has found that such problems can be avoided, if the Super Solder Method, the Super Juffit Method and similar methods are used in the formation of the solder layer. For example, the Super Solder Method is based on a metal alloy production according to metal substitution. Further, the Super Juffit Method is based on the formation of an adhesive coating, adhesion of solder powders and reflowing of the solder powders.

In summary, according to the present invention, when different types of electronic elements such as semiconductor chips are mounted on the single packaging substrate using different packaging methods of wire bonding and flip chip bonding, each electronic element can be completely connected to the bonding pads, thereby providing an electronic device with a high reliability.

What is claimed is:

1. A packaging substrate, for electronic elements, on which substrate two or more electronic elements are mounted through flip chip bonding and wire bonding, said packaging substrate comprising:
    at least one first area designed to receive thereon an electronic element through flip chip bonding and at least one second area designed to receive thereon an electronic element through wire bonding;
    the first area of said packaging substrate having at least one bonding pad to which an external terminal of the electronic element is connected, the bonding pad comprising a copper-based material having directly applied on a surface thereof a coating of a solder material; and
    the second area of said packaging substrate having at least one bonding pad to which an end portion of the bonding wire, extended from an external terminal of the electronic element, is connected, the bonding pad comprising a copper-based material having applied on a surface thereof a plating layer comprising a combination of nickel plating and gold plating.

2. A packaging substrate according to claim 1, in which said packaging substrate has the first area for flip chip bonding and the second area for wire bonding on different surfaces thereof.

3. A packaging substrate according to claim 1, in which said packaging substrate has the first area for flip chip bonding and the second area for wire bonding on the same surface thereof.

4. A packaging substrate according to claim 3, in which said first area for flip chip bonding and said second area for wire bonding are discretely positioned in the same surface of said packaging substrate.

5. A packaging substrate according to claim 3, in which said second area for wire bonding is positioned surrounding said first area for flip chip bonding in the same surface of said packaging substrate.

6. A packaging substrate according to claim 5, in which an electronic element for wire bonding is mounted over an electronic element for flip chip bonding to provide a stacked structure of the electronic elements in the same surface of said packaging substrate.

7. A packaging substrate according to claim 3, in which another surface of said packaging substrate opposed to the surface having said first and second areas has at least one external connection terminal.

8. A packaging substrate according to claim 1, in which said electronic element is a semiconductor element.

9. An electronic device comprising a packaging substrate and two or more electronic elements mounted through flip chip bonding and wire bonding on the packaging substrate, in which said packaging substrate comprises:
    at least one first area designed to receive thereon an electronic element through flip chip bonding and at least one second area designed to receive thereon an electronic element through wire bonding;
    the at least one first area of said packaging substrate having a bonding pad comprising a copper-based material having directly applied on a surface thereof a coating of a solder material, an electronic element for flip chip bonding being mounted on the first area of said packaging substrate while the bonding pad is electrically connected with an external terminal of the electronic element; and
    the at least one second area of said packaging substrate having a bonding pad comprising a copper-based material having applied on a surface thereof a plating layer comprising a combination of nickel plating and gold plating, an electronic element for wire bonding being mounted on the second area of said packaging substrate while the bonding pad is electrically connected through a bonding wire with an external terminal of the electronic element.

10. An electronic device according to claim 9, in which said packaging substrate has the first and second areas on different surfaces thereof.

11. An electronic device according to claim 9, in which said packaging substrate has the first and second areas on the same surface thereof.

12. An electronic device according to claim 11, in which said first area for flip chip bonding and said second area for wire bonding are discretely positioned in the same surface of said packaging substrate.

13. An electronic device according to claim 11, in which said second area for wire bonding is positioned surrounding said first area for flip chip bonding in the same surface of said packaging substrate.

14. An electronic device according to claim 13, in which the electronic element for wire bonding is mounted over the electronic element for flip chip bonding, and said electronic device has a stacked structure of the electronic elements in the same surface of said packaging substrate.

15. An electronic device according to claim 11, in which another surface of said packaging substrate opposed to the surface having said first and second areas has at least one external connection terminal.

16. An electronic device according to claim 9, in which the electronic element for flip chip bonding has an electrode having a protruded portion comprising gold as a principal component thereof, and the protruded portion of said electrode is bonded through the coating of the solder material to the bonding pad.

17. An electronic device according to claim 9, in which the electronic element for flip chip bonding further comprises an under-filling material applied to a space between the electronic element and the packaging substrate.

18. An electronic device according to claim 9, in which an electronic elements-mounted surface of the packaging substrate has a sealing layer applied over the substrate, said sealing layer having embedded therein the electronic elements, the bonding wire and other parts fabricated on the substrate.

19. An electronic device according to claim 9, in which said electronic element is a semiconductor element.

* * * * *